United States Patent
Chen et al.

(10) Patent No.: US 6,476,706 B1
(45) Date of Patent: *Nov. 5, 2002

(54) CURRENT LIMITER HAVING A HIGH-TEMPERATURE SUPERCONDUCTOR

(75) Inventors: Makan Chen, Baden-Dättwil (CH); Markus Hodis, Ennetbaden (CH); Willi Paul, Wettingen (CH)

(73) Assignee: ABB Research Ltd, Zurich (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/690,831

(22) Filed: Oct. 18, 2000

Related U.S. Application Data

(62) Division of application No. 08/912,833, filed on Aug. 19, 1997.

(30) Foreign Application Priority Data

Aug. 26, 1996 (DE) .......................................... 196 34 424

(51) Int. Cl.[7] .................................................. H01C 7/00
(52) U.S. Cl. ........................ 338/13; 338/32 S; 505/881; 361/19
(58) Field of Search ............................. 338/32 S, 13, 338/53, 55, 61, 9, 10, 320; 505/881, 883, 887, 850; 361/19, 56, 57

(56) References Cited

U.S. PATENT DOCUMENTS

| | | | |
|---|---|---|---|
| 1,146,592 A | * | 7/1915 | Northrup |
| 4,101,820 A | | 7/1978 | Montanari |
| 4,943,792 A | * | 7/1990 | Srivastava et al. .......... 335/216 |
| 4,961,066 A | | 10/1990 | Bergsjö et al. |
| 4,994,932 A | | 2/1991 | Okamoto et al. |
| 5,084,955 A | | 2/1992 | Yamasaki et al. |

(List continued on next page.)

FOREIGN PATENT DOCUMENTS

| | | |
|---|---|---|
| DE | 44 34 819 C1 | 1/1996 |
| DE | 19 20 205 A1 | 12/1996 |

(List continued on next page.)

*Primary Examiner*—Elvin Enad
*Assistant Examiner*—Kyung S. Lee
(74) *Attorney, Agent, or Firm*—Burns, Doane, Swecker & Mathis, L.L.P.

(57) ABSTRACT

On transition from the superconducting state to the normal conducting state, current limiters having a high-temperature superconductor increase their electrical resistance and thereby limit an electric current which is flowing through them. To provide electrical stabilization, the high-temperature superconductor is combined with a silver foil having a layer thickness of <50 μm to form an extensive composite conductor with good conductivity. The ratio of the layer thickness of the high-temperature superconductor to that of the silver foil should be >10. To produce this composite conductor, the silver sheet is placed on one side on a 2 mm thick MgO powder layer and, on the other side, is covered with a 600 μm thick so-called green sheet which contains a high-temperature superconductor powder and an organic binder. In order to stabilize the high-temperature superconductor mechanically after it has been fused together, a 200 μm thick layer consisting of glass or carbon fibers and epoxy resin is applied by vacuum impregnation to at least one side of the composite conductor. In order to produce resistive current limiters, current limiter elements in sheet form, having the specified layer structure, are cut to form meanders and are bonded or pressed onto one another in at least two layers, if appropriate with the interposition of cooling elements. Inductive current limiters are obtained by bending flexible sheets of this type to form tubes and soldering a metal strip of silver over a gap in the ring.

10 Claims, 3 Drawing Sheets

U.S. PATENT DOCUMENTS

| | | | |
|---|---|---|---|
| 5,235,309 A | | 8/1993 | Preisler et al. |
| 5,414,586 A | * | 5/1995 | Hara et al. .................... 361/19 |
| 5,600,522 A | * | 2/1997 | Hull ............................ 361/19 |
| 5,617,280 A | * | 4/1997 | Hara et al. .................... 361/19 |
| 5,796,568 A | * | 8/1998 | Baiatu ........................ 361/106 |
| 5,828,291 A | * | 10/1998 | Baumann et al. ......... 338/32 S |
| 6,081,987 A | * | 7/2000 | Kalsi et al. .................. 29/599 |
| 6,166,619 A | * | 12/2000 | Baiatu et al. ................ 338/61 |

FOREIGN PATENT DOCUMENTS

| | | |
|---|---|---|
| DE | WO 96/38864 | * 12/1996 |
| EP | 0 592 797 A2 | 4/1994 |
| JP | 5-251758 | 9/1993 |
| JP | 5-251763 | 9/1993 |
| WO | WO 96/10269 | 4/1996 |

* cited by examiner

CURRENT LIMITER HAVING A HIGH-TEMPERATURE SUPERCONDUCTOR

This application is a divisional, of application No. Ser. 08/912,833, filed Aug. 19, 1997.

BACKGROUND OF THE INVENTION

1. Field of the Invention

The invention is based on a process for producing a current limiter having a high-temperature superconductor, and on a current limiter,

2. Discussion of Background

EP 0,592,797 A2 discloses a process for producing a circular-cylindrical high-temperature superconductor with high current-carrying capacity for screening purposes and for inductive current limiters, in which, for use as magnetic screening, the silver which is put in the casting mold acts as a highly conductive bypass for the high-temperature superconductor. In this case $Bi_2Sr_2CaCu_2O_8$ powder, for example, either in dry form or as a suspension consisting of powder, organic solvent and binder, is introduced at room temperature via a feed trough into the casting mold. After the binder has been baked out at 500° C.±50 K., partial melting of the high-temperature superconductor takes place, with subsequent cooling and slow annealing up to three times in an oxygen atmosphere. In this case, self-supporting superconducting cylinders having a wall thickness of 2.5 mm are peeled from the 200 $\mu$m thick silver mold, while superconducting cylinders having a wall thickness of 50 $\mu$m cannot be separated from a 50 $\mu$m thick silver layer, which is located on a 1 mm thick Ni-Cr or Fe-Ni alloy, as a support. This silver-coated Ni-Cr or Fe-Ni layer then acts as mechanical and electrical reinforcement in current limiters.

A disadvantage in this case is that a 200 $\mu$m thick silver mold for high-temperature superconductors is relatively expensive. Silver-coating Ni-Cr or Fe-Ni layers are demanding to produce. Furthermore, the hot high-temperature superconductor makes fine holes in thin silver layers (<100 $\mu$m). Liquid high-temperature superconductor emerges through these holes and reacts with the support of the silver layer, so that the high-temperature superconductor becomes contaminated.

DE 4,434,819 C1 discloses a current limiter which, on each of the two sides of a 1 mm thick sheet of insulator made of firing resin reinforced with glass fibers or of an MgO ceramic plate, has a composite conductor consisting of a high-temperature superconductor and a normal conductor made of a metal alloy or metal that is ductile at room temperature. A chemically insulating buffer layer of 1 $\mu$m–5 $\mu$m thick silver is arranged between these composite conductors and the insulator. Each composite conductor is designed with a meander shape, and they are connected to one another in such a way that a current flows in opposite direction in composite-conductor subunit bands of the composite conductors lying directly opposite one another, so that the components of the self-magnetic field perpendicular to the plane of the bands compensate one another and the current limiter modules have low inductance and low loss. The surface-related contact resistively between a main surface of the high-temperature superconductor and of the normal conductor is <1 m$\Omega$cm$^2$, preferably $\leq$10 $\mu$m$\Omega$cm$^2$. In the case when the superconductor sheets have been fired in a silver mold which is made of a 100 $\mu$m thick silver sheet that is removed after the firing, the sheet insulator is applied to the silver buffer layer using an adhesive.

For current limitation applications, the silver substrate needs to be removed because of its insufficient electrical resistance. In order to provide electrical stabilization, the high-temperature super-conductor is subsequently re-coated with a high-resistance normal electrical conductor. This production process is relatively elaborate and quite expensive because of the amounts of silver that are required.

Firing substrates on a nickel-based alloy having a thin protective coating of silver or of MgO ceramic do not need to be removed after the high-temperature superconductor has been produced, and serve as mechanical stabilization for this superconductor. The thickness of the normal conductor is in the range of 10 $\mu$m–15 $\mu$m, and that of the high-temperature superconductor is in the range of 0.3 mm–3 mm.

For current limiters, it is desirable to produce superconducting hollow cylinders or sheets that are as thin-walled as possible in order to keep their AC losses as low as possible. At the same time, the superconductor needs electrical stabilization whose resistance is neither too low nor too high.

The only substrates which do not lead to reduction of the superconducting properties of the high-temperature superconductor are silver, gold and MgO. Although an Ag/Au alloy containing 5% Au would have a higher resistance than pure silver, it is much more expensive than silver. MgO substrates cannot be used directly as electrical stabilization, and MgO parts of the required quality are also more expensive than pure silver. Reducing the layer thickness of the silver foil used as substrate would both reduce the cost of the substrate and increase its electrical resistance, so that it could be used directly as electrical stabilization.

SUMMARY OF THE INVENTION

Accordingly, one object of the invention, is to provide a novel process for producing a current limiter having a high-temperature superconductor, and a novel current limiter of the type mentioned at the start, such that it is simpler and less expensive to produce.

One advantage of the invention consists in that the silver foil used for firing the high-temperature superconductor only needs to be about 20 $\mu$m thick. The high-temperature superconductor does not become contaminated, nor does it bond with the support of the silver foil. The silver foil may subsequently be left as electrical stabilization on the superconductor.

According to one advantageous refinement of the invention, relatively flexible sheets can be bent to form tubes and can be electrically connected to one another at the seams.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
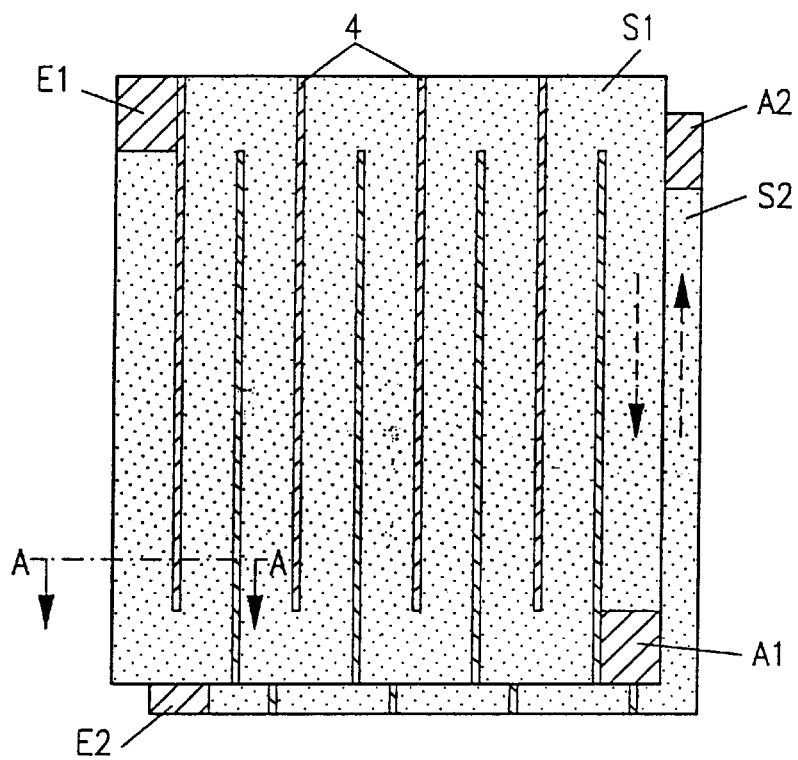
FIGS. 1 and 2 show a perspective view of two different arrangements of current limiter elements in meander form.
Figure 3:
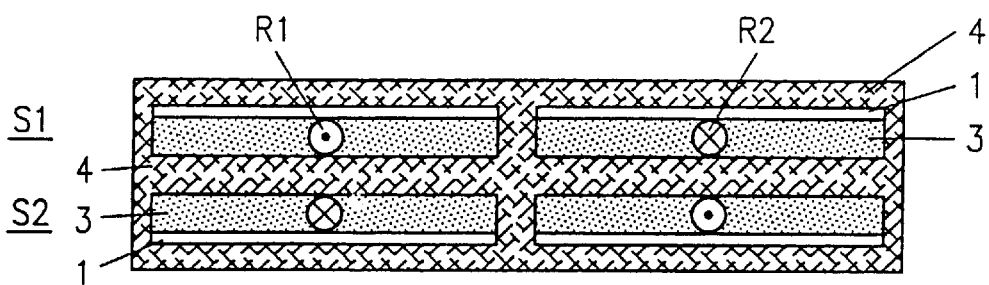
FIG. 3 shows a sectional view at 3—3 in FIG. 1, with the addition of a mechanical stabilization layer into which the current limiter elements are fitted.

Referring now to the drawings, wherein like reference numerals designate identical or corresponding parts throughout the several views, FIG. 1 shows a perspective view of two identically designed current limiter elements (S1, S2) in meander form, with input electrical contacts (E1) and (E2) made of silver and output electrical contacts (A1) and (A2), likewise made of silver. The current limiter elements (S1, S2) are arranged at a small distance behind one another and are fitted into a mechanical stabilization layer (4) made of a fiber-reinforced plastic, preferably a composite made of carbon fibers or glass fibers and epoxy resin, as can be seen from a cross-sectional view in FIG. 3, on a section line 3—3 with a viewing direction corresponding to the two arrows in FIG. 1. A current entering the current limiter element (S1) or (S2) in the input electrical contact (E1) or (E2), and emerging from the output electrical contact (A1) or (A2), flows in a first meander track of the current limiter element (S1) in a first current flow direction (R1), which is indicated in FIG. 3 by a dot in a circle. In the neighboring meander track of the same current limiter element (S1), and in that meander track of the current limiter element (S2) which lies below this first meander track, the current flows in a second current flow direction (R2) which is the opposite of the first current flow direction (R1) and is indicated in FIG. 3 by an x in a circle. This arrangement is suitable for electrically connecting the two current limiter elements (S1, S2) in parallel.

The upper part of FIG. 3 shows two adjacent tracks of the first current limiter element (S1), and below this two adjacent tracks of the second current limiter element (S2), which are entirely fitted into the mechanical stabilization layer (4). The current limiter elements (S1, S2) contain composite conductors comprising a normal conductor, or a silver foil (1), and a high-temperature superconductor (3).

Figure 4:
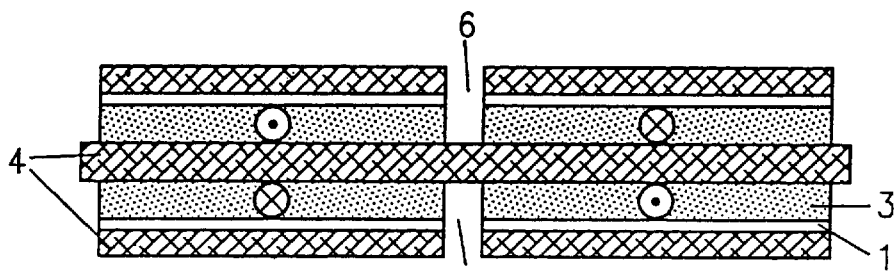
FIG. 4 shows an alternative to FIG. 3 for fitting the current limiter elements.

The current limiter elements (S1, S2) may also be assembled and fitted into the mechanical stabilization layer (4) in the manner shown by FIG. 4. In this case, meander gaps (6) are provided not only between neighboring tracks of the composite conductors of a given current limiter element (S1, S2), but also in the mechanical stabilization layer (4) thereof.

Figure 2:
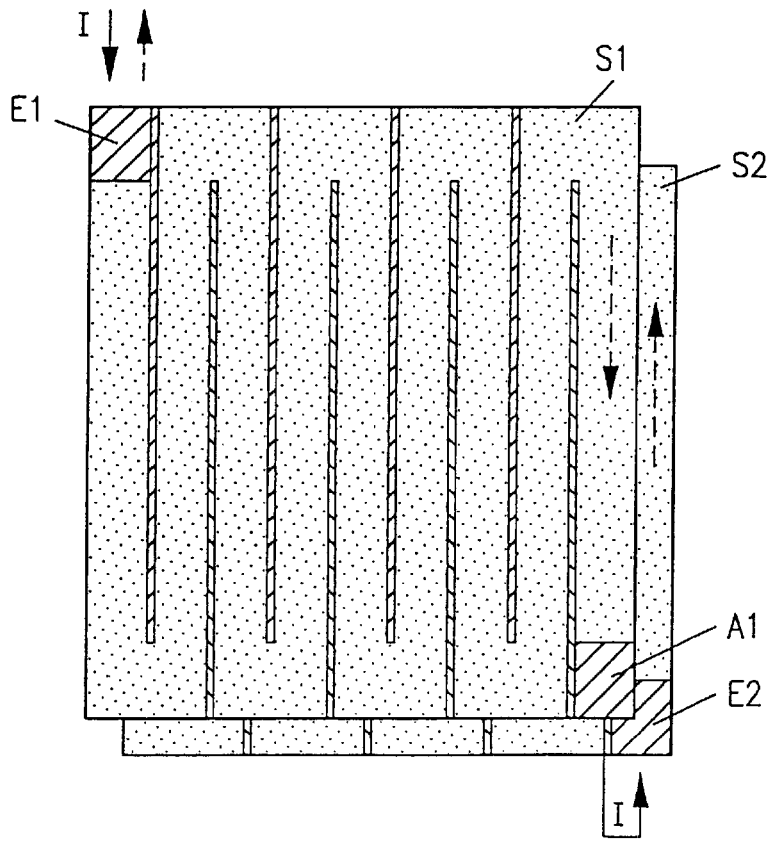

FIG. 2 shows two current limiter elements (S1, S2) in perspective, the first current limiter element (S1) being arranged as in FIG. 1, but the second current limiter element (S2) being rotated through 180° relative to the one represented in FIG. 1. This arrangement is suitable for electrically connecting the two current limiter elements (S1, S2) in series, the output electrical contact (A1) of the current limiter element (S1) being electrically connected to the input electrical contact (E2) of the current limiter element (S2). The arrows indicate the direction in which a current (I) flows. Here again, the current (I) flows in mutually opposite first and second flow directions (R1) or (R2) in the meander tracks which are beside one another and in those which are above one another.

Figure 5:
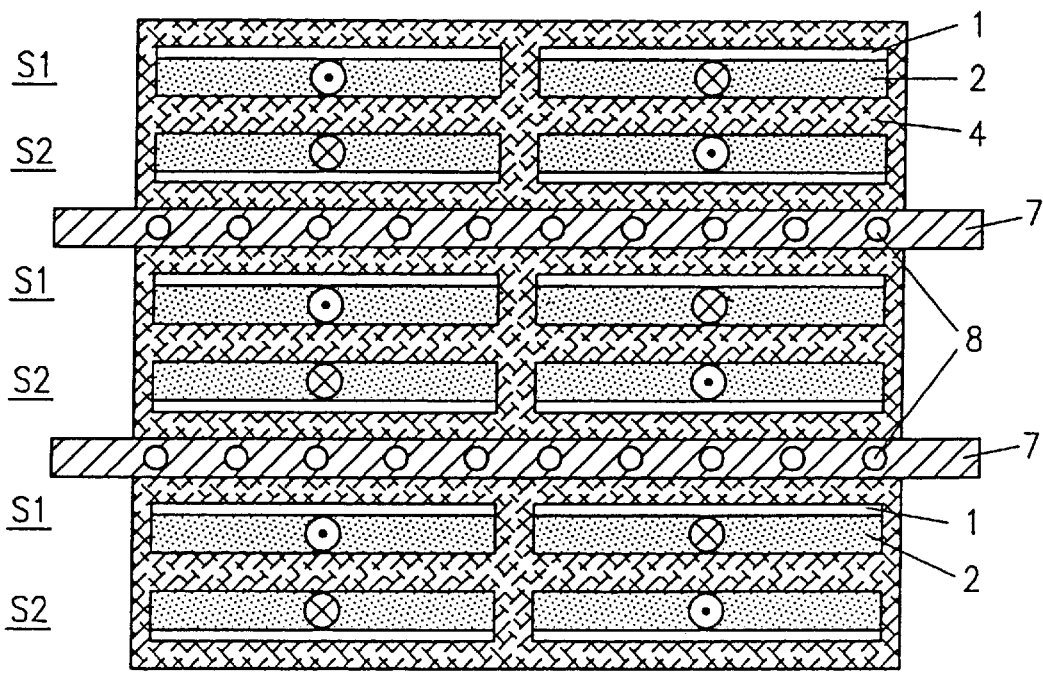
FIG. 5 shows a sectional view through a current limiter in meander form, having a plurality of current limiter elements and interposed cooling elements.

FIG. 5 shows 6 current limiter elements (S1, S2) fitted into a mechanical stabilization layer (4), each pair of which elements form double meander tracks according to FIG. 1. These double meander tracks are pressed or bonded on top of one another to form a stack using a fiber-reinforced plastic (4), cooling elements (7) having cooling channels (8) for a coolant, preferably liquid nitrogen, being arranged between them. Metal or ceramic sheets are suitable as the cooling elements (7).

Figure 6:
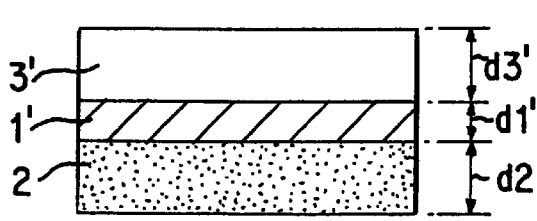
FIG. 6 shows a sectional view of a layer structure for producing a composite conductor.

FIG. 6 shows excerpts of a layer structure (not to scale) for the production of a composite conductor consisting of silver foil (1) and the high-temperature superconductor (3).

A silver foil (1') having a layer thickness (d1') of preferably 20 $\mu$m is applied to an inert powder layer (2) which has a thickness (d2) of preferably 2 mm and is made of a material which, when it is hot, is chemically inert with respect to the high-temperature superconductor (3). Magnesium oxide MgO is, in particular, suitable for this inert powder layer (2). In addition to or instead of MgO, it is also possible to use $Ce_2O_3$, $SrZrO_3$, $SrSO_4$, $Y_2O_3$ and $ZrO_2$ powders. A so-called green sheet (3') having a layer thickness (d3') of preferably 600 $\mu$m, which contains oxide ceramic powder for the high-temperature superconductor (3) as well as an organic binder, is fired onto the silver foil (1'). Preferably, a high-temperature superconductor (3) having a Bi compound, preferably having a Bi2212 compound of composition $Bi_2Sr_2Ca_1Cu_2O_x$, with $7 \leq x \leq 9$, is produced. The pulverulent starting material for the high-temperature superconductor should occupy a proportion by volume in the range of 20%–60% in the green sheet (3'). Preferably, silver powder occupying a proportion by volume in the range of 1% 30% should be admixed to the pulverulent starting material (3'). The heat and oxygen treatment for producing the above-mentioned composite conductor is described in EP 0,592,797 A2 which was mentioned at the start.

Figure 7:
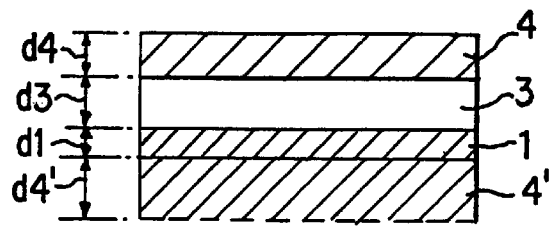
FIG. 7 shows a side view through a composite conductor with mechanical stabilization layers.

The result of the superconductor production is a composite conductor having a silver foil (1) with a layer thickness (d1) and having a high-temperature superconductor (3) with a layer thickness (d3), as can be seen in FIG. 7. During the firing process, the thickness of the green sheet (3') decreases to about 200 $\mu$m. At the same time, about 5% of Ag dissolves in the liquid high-temperature superconductor (3), so that the layer thickness (d1') of the silver foil (1) is reduced to 10 $\mu$m (d1). In this case, the silver foil (1') is detached locally from the high-temperature superconductor melt (3). The inert powder layer (2) prevents outflow of the high-temperature superconductor (3), reduction of the superconducting properties of the high-temperature superconductor (3) and bonding to the support (not shown) of the inert powder layer (2). The contact resistance between the high-temperature superconductor (3) and the silver foil (1) is less than 1 $\mu\Omega cm^2$. The high-temperature superconductor (3) contains a proportion of silver in the range of 3%–30%.

In order to provide mechanical stabilization, is applied to a mechanical stabilization layer (4) which has a thickness (d4) of preferably 200 $\mu$m and is made of a fiber-reinforced plastic is acutely this composite conductor (1, 3) on at least one side or main surface by vacuum impregnation. In this form, the sheets thus produced are ready for use as electromagnetic screening. In addition to the mechanical stabilization layer (4), a mechanical stabilization layer (4'), represented by dashes, having a thickness (d4') approximately equal to the thickness (d4), may be applied to a second main surface of the composite conductor (1, 3).

Figure 8:
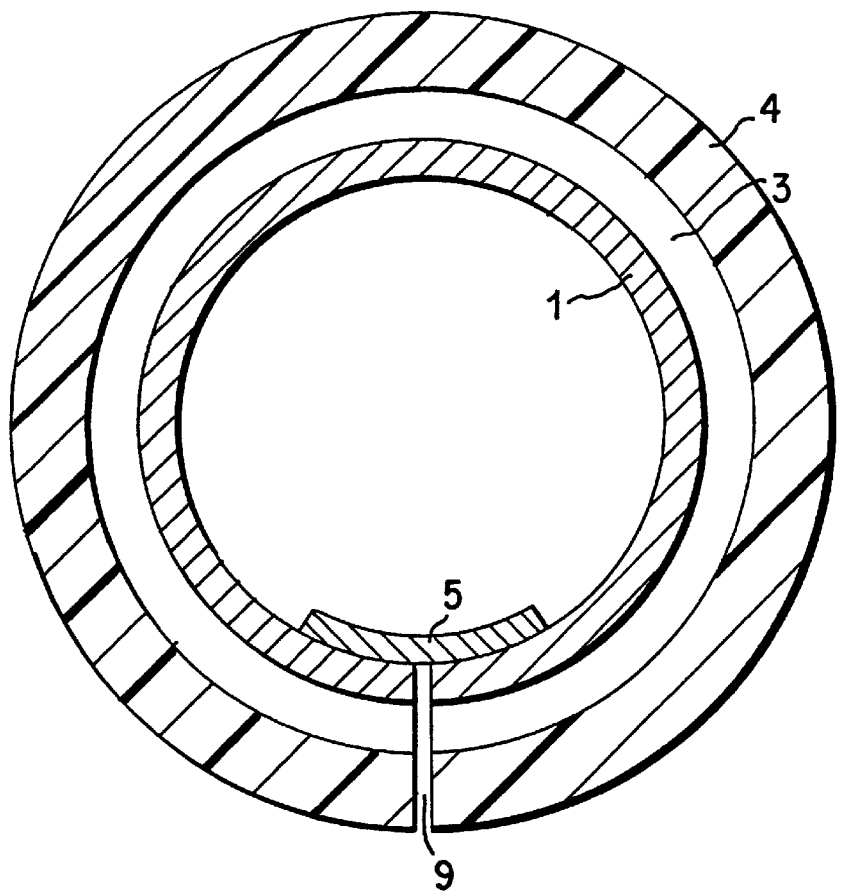
FIG. 8 shows a cross section of a tubular current limit element.

The relatively flexible sheets consisting of a composite conductor (1, 3) and a mechanical stabilization layer (4) can be bent to form tubes and electrically connected to one another at the interfaces, or at a gap (9) in the ring, using a metal strip (5) made of a highly conductive metal, preferably silver or copper. A tube of this type is represented in cross section in FIG. 8. The metal strip (5) may, for example, be 4 cm wide, 200 μm thick and welded to the silver foil (1). In this embodiment, the current limiter according to FIG. 8 is suitable for inductive current limitation.

For resistive current limitation, two current limiter elements (S1, S2), or a multiple thereof, are bonded or pressed to one another and, if appropriate, structured in meanders, as can be seen in FIG. 5. To minimize the AC losses, these sheets are electrically connected in such a way that the current (I) in two neighbouring sheets respectively flows in opposite directions.

If silver is admixed to the high-temperature superconductor powder (3') actually before the partial melting, the reduction of the silver foil (1') can be controlled or fully suppressed. In any case, however, fine holes will appear in the thin silver foil (1), since up to 30 μm long high-temperature superconductor needles (not shown) grow into the silver when the high-temperature superconductor (3) solidifies.

Illustrative Embodiment 1

A 600 μm thick green sheet (31) having a high-temperature superconductor powder of composition $Bi_2Sr_2Ca_1Cu_2O_x$ was produced using a sheet casting process. This green sheet (3') was applied with a thickness of 10 cm and a length of 120 cm to a 20 μm thick silver foil (1) which was supported on MgO powder (2). After the binder contained in the green sheet (3') had been baked out, the high-temperature superconductor (3) was partially fused. After solidification, the layer thickness (d3) of the high-temperature superconductor (3) was about 200 μm and the layer thickness (d1) of the silver foil (1) was about 10 μm. The contact resistance between the high-temperature superconductor (3) and the silver foil (1) was less than 1 $\mu\Omega cm^2$. The critical current density of the high-temperature superconductor (3) was 3 kA/cm².

The composite conductor (1, 3) was then mechanically reinforced on the side having the high-temperature superconductor (3) with a 200 μm thick glass fiber/epoxy resin composite. The relatively flexible band obtained in this way, having dimensions of 400 μm×60 cm×10 cm, was then shaped to form a ring having a diameter of 8 cm. The ends of the band were electrically connected by welding using a 200 μm thick and 4 cm wide normally conducting Ag or Cu strip (5), and subsequently reinforced mechanically with a further layer of glass fibers/ epoxy resin composite (4, 4') on both sides.

The ring obtained in this way had a current-carrying capacity of 800 A. The low electrical resistance, of about 3 μΩ, which the ring also exhibited in the superconducting state, did not impair operation in the inductive current limiter. A plurality of rings may be interconnected in order to obtain a higher total current.

Illustrative Embodiment 2

A 1.2 mm thick green sheet (3') having a high-temperature superconductor powder of composition $Bi_2Sr_2Ca_1Cu_2O_x$ and 5% silver admixture was produced using a sheet casting process. The 20 cm×20 cm wide sheet was structured in meanders, with a path width of 1 cm, and applied to a 20 μm thick silver foil (1) which was supported on MgO powder (2). After the binder had been baked out, the high-temperature superconductor (3) was partially fused. After solidification, the layer thickness (d3) of the high-temperature superconductor (3) was about 400 μm and the layer thickness (d1) of the silver foil (1) was still about 20 μm, on account of the admixture of silver to the green sheet (31). The contact resistance between the high-temperature superconductor (3) and the silver foil (1) was less than 1 $\mu\pi cm^2$. The critical current density of the high-temperature superconductor (3) was 2 kA/cm² and the current-carrying capacity of the meander was 80 A.

The meander was reinforced on the side having the high-temperature superconductor (3) with a 300 μm thick carbon fiber/epoxy resin composite. The silver foil (1) still remaining in the meander gaps (6) was then removed. Two of the meanders according to FIG. 2 which were obtained in this way were then bonded to one another and electrically connected at one end in such a way that a current (I) flowing through the meanders flowed in mutually opposite flow directions (R1, R2) in opposite meander strips. This current limiter is used for resistive current limitation.

Illustrative Embodiment 3

A 300 μm thick green sheet (3') having a high-temperature superconductor powder of composition $Bi_2Sr_2Ca_1Cu_2O_x$ was produced using the sheet casting process. The 20 cm×20 cm wide sheet was applied to a 25 μm thick silver foil (1) which was supported on MgO powder (2). After the binder had been baked out, the high-temperature superconductor (3) was partially fused. After solidification, the layer thickness (d3) of the high-temperature superconductor (3) was about 100 μm and the layer thickness (d1) of the silver foil (1) was about 20 μm. The contact resistance between the high-temperature superconductor (3) and the silver foil (1) was less than 1 $\mu\Omega cm^2$. The critical current density of the high-temperature superconductor (3) was 8 kA/cm².

The composite conductor (1, 3) was then mechanically reinforced on both main surfaces with a 200 μm thick glass fiber/epoxy resin composite. Two sheets of this type were bonded to one another and subsequently structured as meanders. Three of these double meanders were bonded to two aluminum cooling elements (7), in accordance with FIG. 5. The cooling elements (7) are used for cooling as well as mechanically stabilizing the resistive current limiter.

It is important that the high-temperature superconductor (3) has a layer thickness d3 <500 μm, that the silver layer (1) has a thickness d1 of <25 μm and that d1/d3 <⅕. It is preferable that d3 <300 μm, d1 <10 μm and d1/d3 ⅒. The mechanical stabilization layer (4, 4') should have a thickness (d4, d4') in the range of 50 μm–1 mm and contain a fiber-reinforced plastic made of epoxy resin reinforced with glass or carbon fibers.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by latest patent of the United States is:

1. A current limiter comprising:
    at least one high-temperature superconductor and at least one non-superconducting shunt resistor in parallel with the high-temperature superconductor and forming a composite conductor with the latter;
    at least two current limiter elements comprising composite conductors, and being placed in such a way that a current flows in opposite directions in mutually opposite tracks of the composite conductors;
    the at least two current limiter elements are electrically connected in parallel.
2. The current limiter as claimed in claim 1, wherein the at least two current limiter elements are designed identically and comprise composite conductors in the form of meanders.

3. The current limiter as claimed in claim 1, further comprising a mechanical stabilization layer into which the at least two current limiter elements are placed.

4. The current limiter as claimed in claim 3, wherein the stabilization layer contains an epoxy resin reinforced with glass or carbon fibers.

5. The current limiter as claimed in claim 1, wherein the high-temperature superconductor contains a Bi2212 compound.

6. The current limiter as claimed in claim 1, further comprising a mechanical stabilization layer which separates an adjacent pair of the at least two current limiter elements, the pair of current limiter elements being of the same size and shape and rotated 180° with respect to each other.

7. The current limiter as claimed in claim 1, further comprising cooling channels through which liquid coolant passes to cool the current limiter during operation thereof.

8. The current limiter as claimed in claim 1, further comprising cooling channels through which liquid nitrogen passes to cool the current limiter during operation thereof.

9. The current limiter as claimed in claim 1, wherein the superconductor comprises $Bi_2Sr_2Ca_1Cu_2O_x$.

10. The current limiter as claimed in claim 1, wherein current in the at least two current limiters flows in identically shaped paths but in opposite directions in the paths located adjacent each other.

* * * * *